(12) United States Patent
Lee et al.

(10) Patent No.: US 7,433,379 B2
(45) Date of Patent: Oct. 7, 2008

(54) VERTICAL-CAVITY SURFACE EMITTING LASER

(75) Inventors: Eun-Hwa Lee, Suwon-si (KR); Young-Hyun Kim, Suwon-si (KR); In Kim, Suwon-si (KR); Yu-Dong Bae, Suwon-si (KR)

(73) Assignee: Samsung Electronics Co., Ltd., Maetan-Dong, Yeongtong-Gu, Suwon-Si, Gyeonggi-Do (KR)

( * ) Notice: Subject to any disclaimer, the term of this patent is extended or adjusted under 35 U.S.C. 154(b) by 140 days.

(21) Appl. No.: 11/584,987

(22) Filed: Oct. 23, 2006

(65) Prior Publication Data

US 2007/0183472 A1    Aug. 9, 2007

(30) Foreign Application Priority Data

Feb. 9, 2006    (KR) .................. 10-2006-0012621

(51) Int. Cl.
*H01S 5/00*    (2006.01)
(52) U.S. Cl. ............................. 372/50.11; 372/46.01
(58) Field of Classification Search ............. 372/50.11, 372/46.01; 438/22; 257/84
See application file for complete search history.

(56) References Cited

U.S. PATENT DOCUMENTS

| | | | | |
|---|---|---|---|---|
| 5,568,501 | A | * | 10/1996 | Otsuka et al. ............ 372/46.01 |
| 6,717,969 | B2 | * | 4/2004 | Asano ..................... 372/46.01 |
| 7,274,720 | B2 | * | 9/2007 | Asano ..................... 372/46.01 |
| 2002/0177250 | A1 | * | 11/2002 | Zhu et al. ..................... 438/42 |

* cited by examiner

*Primary Examiner*—Minsun Harvey
*Assistant Examiner*—Tuan N. Nguyen
(74) *Attorney, Agent, or Firm*—Cha & Reiter, LLC

(57) ABSTRACT

A vertical-cavity surface emitting laser includes a substrate and a first mirror that is grown on the substrate, a second mirror grown on the first mirror for resonating the first mirror and light, an active layer between the first mirror and the second mirror for generating and amplifying the light, an upper electrode grown on the active layer and a lower electrode formed on the first mirror for supplying current to the active layer, a planarizing polymer formed on the first mirror for burying the active layer and the second layer, and a first external terminal extending from the upper electrode in a vertical upward direction to be exposed to the top surface of the planarizing polymer and a second external terminal extending from the lower electrode to expose its one surface to the top surface of the planarizing polymer.

14 Claims, 3 Drawing Sheets

US 7,433,379 B2

VERTICAL-CAVITY SURFACE EMITTING LASER

CLAIM OF PRIORITY

This application claims priority under 35 U.S.C. § 119 to an application entitled "Vertical-Cavity Surface Emitting Laser," filed in the Korean Intellectual Property Office on Feb. 9, 2006 and assigned Serial No. 2006-12621, the contents of which are incorporated herein by reference.

BACKGROUND OF THE INVENTION

1. Field of the Invention

The present invention generally relates to a vertical-cavity surface emitting laser that emits laser light in perpendicular to the growing direction of an active layer, and in particular, to a modularized vertical-cavity surface emitting laser that can be bonded by flip-chip bonding.

2. Description of the Related Art

A vertical-cavity surface emitting laser has been used in a device that requires an optical interconnection structure and in various forms of laser light sources due to its low threshold current, circular light pattern, and a better choice over an edge emitting laser as it can be arranged two-dimensionally.

The vertical-cavity surface emitting laser typically includes a first mirror layer and a second mirror layer that are sequentially deposited on a semiconductor substrate, and an active layer having a multiple quantum well structure grown between the first mirror layer and the second mirror layer. When an electrical current to the active layer is applied, laser light emits in perpendicular to the growing direction of the active layer. A distributed Bragg reflector or a structure on which multi-layered dielectric materials are deposited may be used as the first mirror layer and the second mirror layer. The first mirror layer and the second mirror layer resonate the light generated from the active layer, and emit laser light having coherence of predetermined intensity and wavelength through one vertical end of the vertical-cavity surface emitting laser.

In the vertical-cavity surface emitting laser, two electrodes for supplying current may be formed on an upper portion of the vertical-cavity surface emitting laser, and on the bottom of the semiconductor substrate. However, the electrode of the vertical-cavity laser is electrically connected to an external electrode by wire bonding, causing an increase in its volume and driving voltage due to electrical loss. As a result, the vertical-cavity laser cannot be used in digital devices having a tendency towards slimness for portability.

SUMMARY OF THE INVENTION

It is, therefore, an object of the present invention to provide a vertical-cavity surface emitting laser that can be optically connected by flip-chip bonding and has a small size.

It is another object of the present invention to minimize loss of an optical signal and current.

According to one aspect of the present invention, there is provided a vertical-cavity surface emitting laser, which includes a substrate and a first mirror that is grown on the substrate, a second mirror grown on the first mirror for resonating the first mirror and light, an active layer between the first mirror and the second mirror for generating and amplifying the light, an upper electrode grown on the active layer and a lower electrode formed on the first mirror for supplying current to the active layer, a planarizing polymer formed on the first mirror for burying the active layer and the second mirror, and a first external terminal extending from the upper electrode in a vertical upward direction to be exposed to the top surface of the planarizing polymer and a second external terminal extending from the lower electrode to expose its one surface to the top surface of the planarizing polymer.

BRIEF DESCRIPTION OF THE DRAWINGS

The above features and advantages of the present invention will become more apparent from the following detailed description when taken in conjunction with the accompanying drawings in which.

DETAILED DESCRIPTION OF THE INVENTION

Now, embodiments of the present invention will now be described in detail with reference to the annexed drawings. For the purposes of clarity and simplicity, a detailed description of known functions and configurations incorporated herein has been omitted for conciseness.

Figure 1:
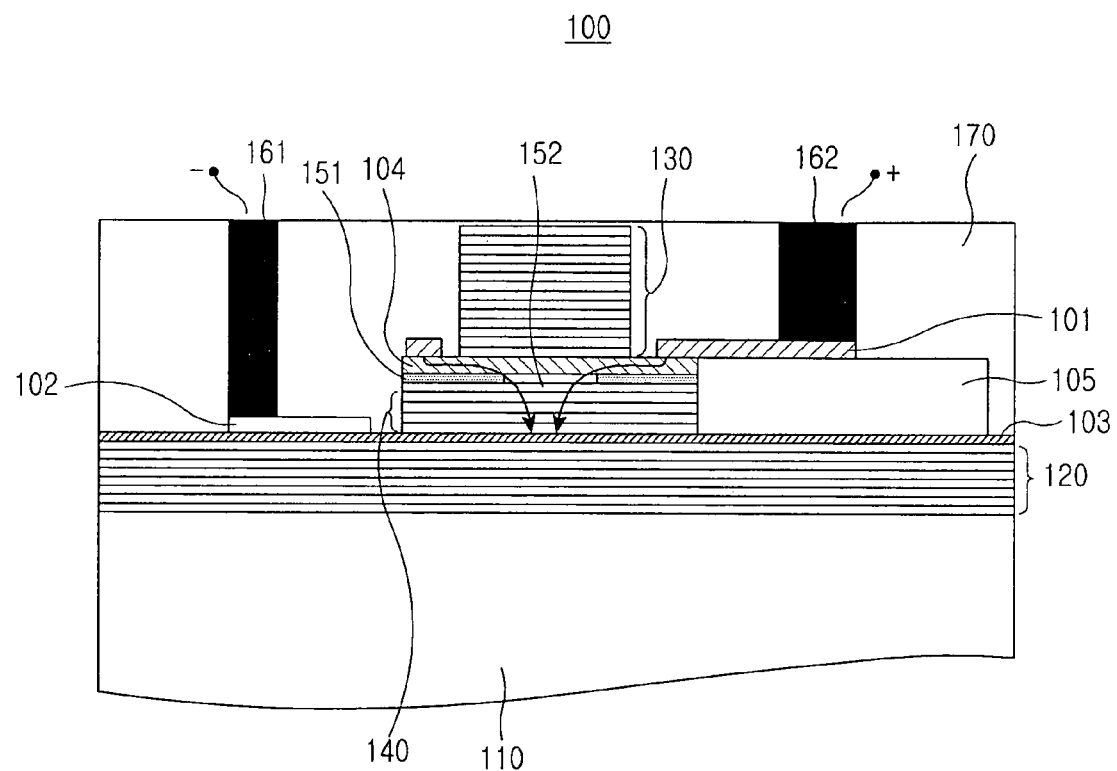
FIG. 1 illustrates a vertical-cavity surface emitting laser according to a first embodiment of the present invention.

FIG. 1 illustrates a vertical-cavity surface emitting laser 100 according to a first embodiment of the present invention. As shown, the vertical-cavity surface emitting laser 100 includes a substrate 110, a first mirror 120 and a second mirror 130 that are grown on the substrate 110, an active layer 140 between the first mirror 120 and the second mirror 130, an upper electrode 101, a lower electrode 102, a first contact layer 103 between the active layer 140 and the first mirror 120, a second contact layer 104 between the second mirror 130 and the active layer 140, an insulating layer 151 between the second contact layer 104 and the active layer 140, an insulating pad 105 between the upper electrode 101 and the first contact layer 103 for electrically insulating the upper electrode 101 and the first contact layer 103 from each other, a first external terminal 162 extending from the upper electrode 101, and a second external terminal 161 extending from the lower electrode 102.

The first mirror 120 is grown on the substrate 110, the active layer 140 is grown on the first mirror 120, and the second mirror 130 is grown on the active layer 140. The first mirror 120 and the second mirror 130 are grown on and under the active layer 140 in perpendicular to each other on the substrate 110. The first mirror 120 and the second mirror 130 serve as cavities for resonating light generated by the active layer 140.

If light resonated between the first mirror 120 and the second mirror 130 reaches predetermined intensity and output wavelength, the vertical-cavity surface emitting laser 100 emits the resonated light to one of the first mirror 120 and the second mirror 130 according to the characteristics of a corresponding element.

The first mirror 120 and the second mirror 130 may have a structure in which dielectric materials are grown in the form of a multilayered thin film or a Distributed Bragg Reflector (DBR) structure. The first mirror 120 and the second mirror 130 may be formed as an n-DBR or p-DBR. For example, if the first mirror 120 is formed as a p-DBR, the second mirror 130 is formed as an n-DBR, or vice versa.

The upper electrode 101 is formed on the active layer 140 in the shape of a ring that surrounds the circumference of the second mirror 130 and injects current having a corresponding polarity into the active layer 140.

The lower electrode 102 is formed adjacent to one side of the active layer 140 on the first mirror 120 or formed in the shape of a ring that surrounds the circumference of the active layer 140.

The active layer 140 may be grown in the shape of a structure having a multiple quantum well layer and a Separate Confinement Hereto (SCH) structure layer thereon and generates light using currents having opposite polarities that are injected through the upper electrode 101 and the lower electrode 102. The generated light is amplified by the active layer 140 while being resonated between the first mirror 120 and the second mirror 130.

The first external terminal 162 extends from the upper electrode 101 in such a way to expose its one face to the top surface of a planarizing polymer 170 and supplies current from an external device to the active layer 140 through the upper electrode 101. The second external terminal 161 extends from the lower electrode 102 in such a way to expose its one face to the top surface of the planarizing polymer 170 and supplies current from an external device to a lower portion of the active layer 140 adjacent to the first mirror 120. Conductive metal materials such as gold or copper may be used for the first external terminal 162 and the second external terminal 161, and p+-type GaAs or n+-type GaAs may be used for the first contact layer 103 and the second contact layer 104.

The planarizing polymer 170 is formed on the first mirror 120 to bury the active layer 140 and the second mirror 130 and one faces of the first external terminal 162 and the second external terminal 161 are exposed to the top surface of the planarizing polymer 170. The planarizing polymer 170 may be made of a combination of at least one of polyimide, epoxy, benzocyclobutene (BCB), and polybenzoxazole (PBO).

The insulating layer 151 is disposed between the second contact layer 104 and the active layer 140 and includes a hole 152 through which current can flow in a portion corresponding to the center of the active layer 140. In other words, the insulating layer 151 electrically insulates the second contact layer 104 and the active layer 140 except for the portion corresponding to the center of the active layer 140, so as to supply current from the upper electrode 101 to the center of the active layer 140.

Figure 2:
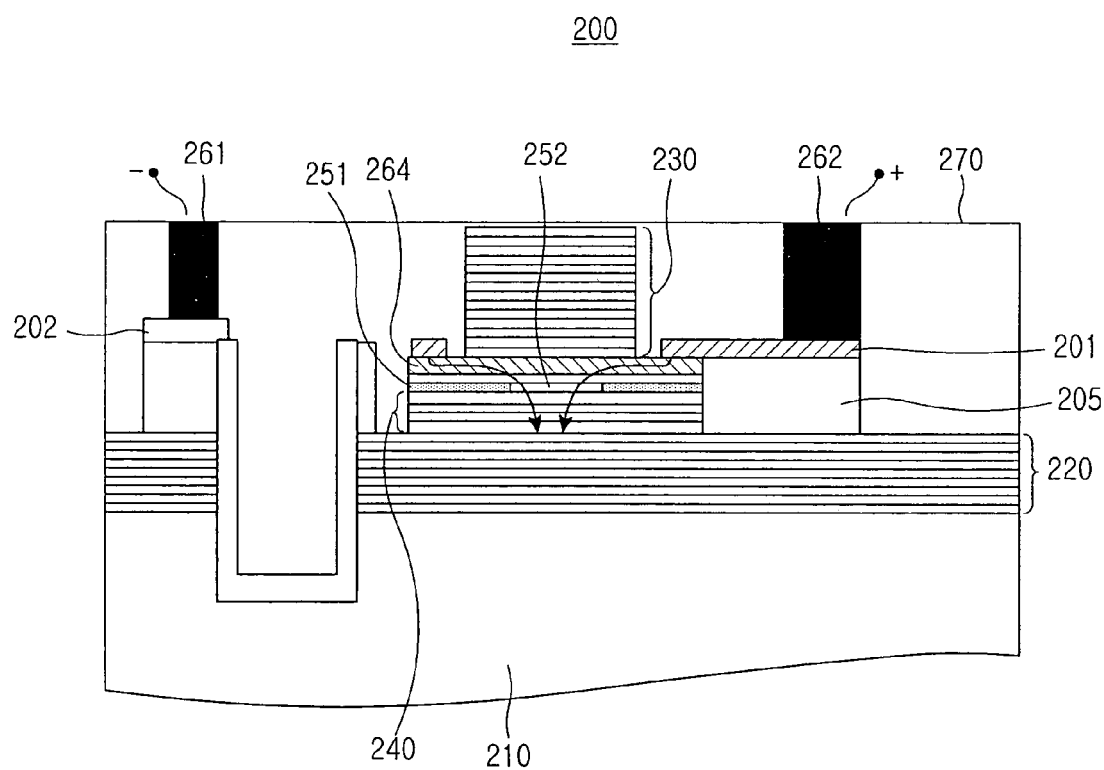
FIG. 2 illustrates a vertical-cavity surface emitting laser according to a second embodiment of the present invention.

FIG. 2 illustrates a vertical-cavity surface emitting laser 200 according to a second embodiment of the present invention. As shown, the vertical-cavity surface emitting laser 200 includes a substrate 210, a first mirror 220, a second mirror 230 that is grown on the first mirror 220, an active layer 240 that is grown between the first mirror 220 and the second mirror 230, an upper electrode 201, a lower electrode 202, a planarizing polymer 270 that is grown on the first mirror 220 to bury the active layer 240 and the second mirror 230, a first eternal terminal 262, a second external terminal 261, a contact layer 264 between the second mirror 230 and the active layer 240, an insulating layer 251 between the contact layer 264 an the active layer 240, a first external terminal 262 extending from the upper electrode 201, and a second external terminal 261 extending from the lower electrode 202.

The substrate 210 has a groove and the first mirror 220 is grown on the substrate 210 to expose its cleaving surface. The second mirror 230 is grown on a portion of the first mirror 220 and resonates light between itself and the first mirror 220. The active layer 240 between the first mirror 220 and the second mirror 230 generates and amplifies light.

The upper electrode 201 is formed on the active layer 240 and the lower electrode 202 is formed to extend to the groove from the top surface of the first mirror 220. The upper electrode 201 and the lower electrode 220 supply current to the active layer 240. A separate insulating material may be inserted between the lower electrode 202 and the first mirror 220.

The first external terminal 262 extends from the upper electrode 201 in a vertical upward direction to be exposed to the top surface of the planarizing polymer 270 and the second external terminal 261 extends from the lower electrode 202 to expose its one surface to the top surface of the planarizing polymer 270. The first external terminal 262 and the first external terminal 261 maintain an electrical contact with an external electrode and supplies current through the upper electrode 201 and the lower electrode 202, respectively.

Figure 3:
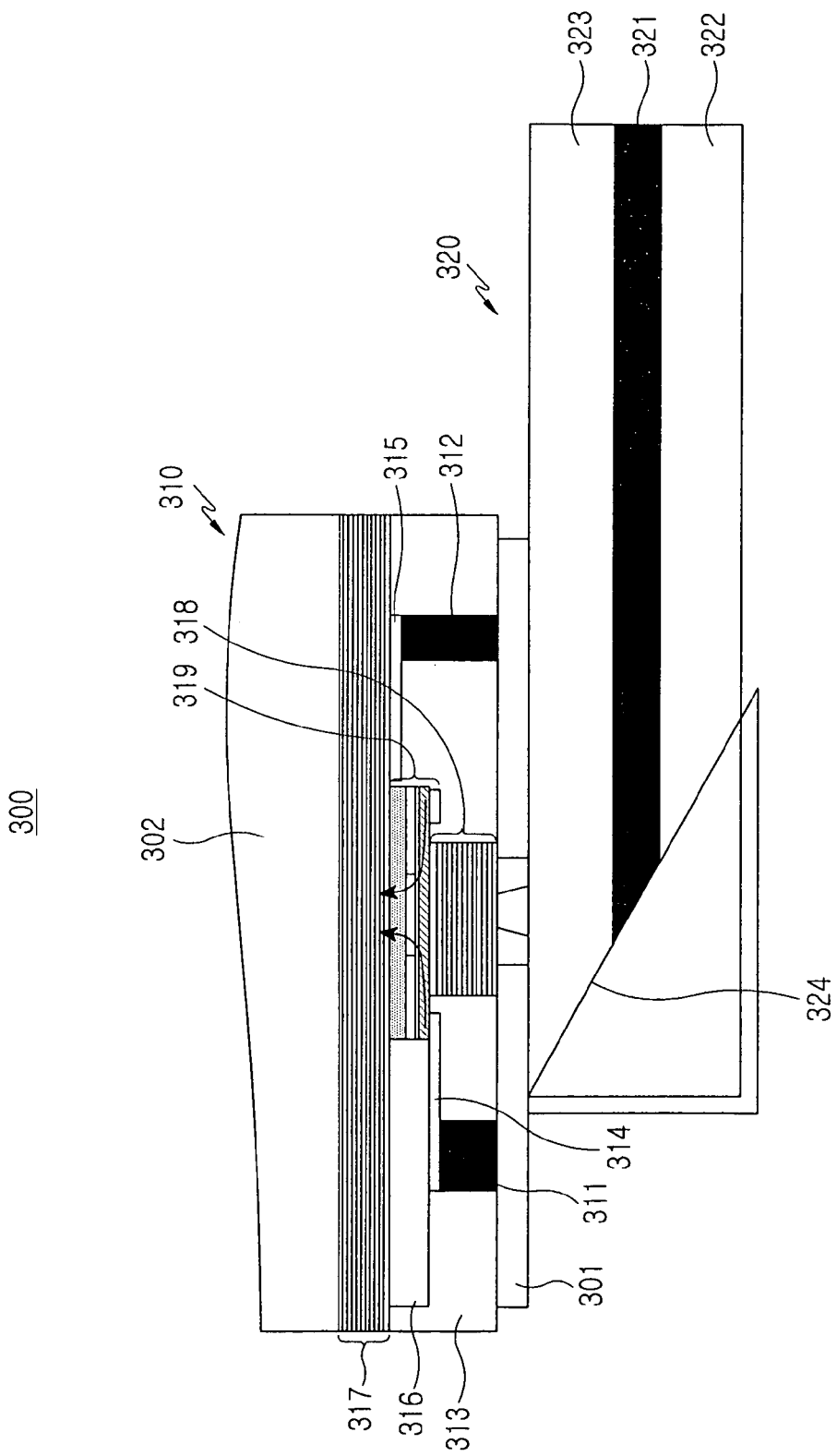
FIG. 3 illustrates an optical connection structure in which a vertical-cavity surface emitting laser and a waveguide are connected according to a third embodiment of the present invention.

FIG. 3 illustrates an optical connection structure 300 in which a vertical-cavity surface emitting laser 310 and a waveguide 320 are connected according to a third embodiment of the present invention. As shown, the optical connection structure 300 includes the vertical-cavity surface emitting laser 310 and the waveguide 320 combined with the vertical-cavity surface emitting laser 310.

The vertical-cavity surface emitting laser 310 has the same structure as that of the first embodiment of the present invention. Hence, a detailed description would be omitted to avoid redundancy. Briefly, the vertical-cavity surface emitting laser 310 includes a substrate 302, a first mirror 317 and a second mirror 318 that are grown on the substrate 302, an active layer 319 between the first mirror 317 and the second mirror 318, a lower electrode 315, an upper electrode 314, an insulating pad 316 between the upper electrode 314 and the first mirror 317, a first external terminal 311 extending from the upper electrode 314, and a second external terminal 312 extending from the lower electrode 315. The vertical-cavity surface emitting laser 310 may also be in the form of the vertical-cavity surface emitting laser 200 according to the second embodiment of the present invention.

The waveguide 320 includes a core 321, clads 322 and 323 surrounding the circumference of the core 321, a reflecting surface 324 for reflecting light generated from the vertical-cavity surface emitting laser 310 at one side, and conductive pads 301 that rest the vertical-cavity surface emitting laser 310 on the top surface of the clad 323 and are electrically connected with the first external electrode 311 and the second external electrode 312.

As shown above, the vertical-cavity surface emitting laser according to the present invention can be electrically connected with external electrodes without using wire bonding and minimize loss of voltage and optical signal. In addition, the vertical-cavity surface emitting laser can be easily used for small-size devices. In other words, the vertical-cavity surface emitting laser has an intra-cavity structure and injects current to an active layer without using a mirror, thereby minimizing driving voltage. Moreover, since the vertical-cavity surface emitting laser includes external terminals that extend directly from electrodes, it can implement coplanar flip-chip bonding.

The present invention can also be used as an optical connection structure in which a substrate of a vertical-cavity surface emitting laser is attached to a sub-mount or a vertical-cavity surface emitting laser is attached to the cover of a housing and emits light to a lower portion.

While the present invention has been shown and described with reference to preferred embodiments thereof, it will be understood by those skilled in the art that various changes in form and details may be made therein without departing from the spirit and scope of the invention.

What is claimed is:

1. A vertical-cavity surface emitting laser comprising:
a substrate and a first mirror that is grown on the substrate;
a second mirror grown on the first mirror for resonating light;
an active layer between the first mirror and the second mirror for generating and amplifying the light;
an upper electrode grown on the active layer and a lower electrode formed on the first mirror for supplying current to the active layer;
a planarizing polymer formed on the first mirror for burying the active layer and the second layer; and
a first external terminal extending from the upper electrode in a vertical upward direction to be exposed to the top surface of the planarizing polymer and a second external terminal extending from the lower electrode to expose its one surface to the top surface of the planarizing polymer.

2. The vertical-cavity surface emitting laser of claim 1, further comprising:
a first contact layer between the active layer and the first mirror;
a second contact layer between the second mirror and the active layer;
an insulating layer between the second contact layer and the active layer; and
an insulating pad between the upper electrode and the first contact layer for electrically insulating the upper electrode and the first contact layer from each other.

3. The vertical-cavity surface emitting laser of claim 1, wherein if the light resonated between the first mirror and the second mirror reaches predetermined intensity and output wavelength, the vertical-cavity surface emitting laser emits the resonated light to one of the first mirror land the second mirror.

4. The vertical-cavity surface emitting laser of claim 1, wherein the first mirror and the second mirror include a structure in which dielectric materials are grown in the form of a multilayered thin film or a Distributed Bragg Reflector (DBR) structure.

5. The vertical-cavity surface emitting laser of claim 1, wherein the first mirror and the second mirror are formed as an n-DBR or p-DBR.

6. The vertical-cavity surface emitting laser of claim 1, wherein the upper electrode is formed on the active layer in the shape of a ring that surrounds the circumference of the second mirror and injects current having a corresponding polarity into the active layer.

7. The vertical-cavity surface emitting laser of claim 1, wherein the lower electrode is formed adjacent to one side of the active layer on the first mirror and formed in the shape of a ring that surrounds the circumference of the active layer.

8. The vertical-cavity surface emitting laser of claim 1, wherein the active layer is grown in the shape of a structure having a multiple quantum well layer and a Separate Confinement Hereto (SCH) structure layer thereon.

9. A vertical-cavity surface emitting laser comprising:
a substrate and a first mirror whose side of one end is exposed on the substrate;
a second mirror grown on the first mirror for resonating light;
an active layer between the first mirror and the second mirror for generating and amplifying the light;
an upper electrode grown on the active layer for supplying current to the active layer and a lower electrode extending from the top surface of the first mirror to a groove;
a planarizing polymer formed on the first mirror for burying the active layer and the second layer; and
a first external terminal extending from the upper electrode in a vertical upward direction to be exposed to the top surface of the planarizing polymer and a second external terminal extending from the lower electrode to expose its one surface to the top surface of the planarizing polymer.

10. The vertical-cavity surface emitting laser of claim 9, further comprising:
a contact layer between the second mirror and the active layer;
an insulating layer between the contact layer and the active layer; and
a first insulating pad between the upper electrode and the first contact layer for electrically insulating the upper electrode and the first contact layer from each other.

11. The vertical-cavity surface emitting laser of claim 9, wherein the planarizing polymer is made of a combination of at least one of polyimide, epoxy, benzocyclobutene (BCB), and polybenzoxazole (PBO).

12. The vertical-cavity surface emitting laser of claim 9, wherein if the light resonated between the first mirror and the second mirror reaches predetermined intensity and output wavelength, the vertical-cavity surface emitting laser emits the resonated light to one of the first mirror 1 and the second mirror.

13. The vertical-cavity surface emitting laser of claim 9, wherein the first mirror and the second mirror include a structure in which dielectric materials are grown in the form of a multilayered thin film or a Distributed Bragg Reflector (DBR) structure.

14. The vertical-cavity surface emitting laser of claim 9, wherein the first mirror and the second mirror are formed as an n-DBR or p-DBR.

* * * * *